United States Patent [19]

Greco et al.

[11] Patent Number: 4,600,683

[45] Date of Patent: Jul. 15, 1986

[54] CROSS-LINKED POLYALKENYL PHENOL BASED PHOTORESIST COMPOSITIONS

[75] Inventors: Stephen E. Greco, Beacon; Dennis C. Green, Hopewell Junction, both of N.Y.

[73] Assignee: International Business Machines Corp., Armonk, N.Y.

[21] Appl. No.: 725,587

[22] Filed: Apr. 22, 1985

[51] Int. Cl.[4] .................... G03C 1/495; G03C 1/52; G03C 1/72
[52] U.S. Cl. ........................... 430/270; 430/325; 430/326; 430/176; 430/192; 430/197; 430/905
[58] Field of Search ............... 430/270, 325, 326, 176, 430/192, 197, 905

[56] References Cited

U.S. PATENT DOCUMENTS

| | | | |
|---|---|---|---|
| 3,869,292 | 3/1975 | Peters | 430/197 X |
| 4,041,191 | 8/1977 | Leclerc et al. | 427/43 |
| 4,061,799 | 12/1977 | Brewer et al. | 427/43 |
| 4,104,070 | 8/1978 | Moritz et al. | 430/194 X |
| 4,121,936 | 10/1978 | Matsuda et al. | 96/35.1 |
| 4,247,616 | 1/1981 | Vikesland et al. | 430/192 |
| 4,409,317 | 10/1983 | Shiraishi | 430/326 X |
| 4,415,653 | 11/1983 | Lai et al. | 430/296 |
| 4,439,516 | 3/1984 | Cernigliaro et al. | 430/323 |

*Primary Examiner*—John E. Kittle
*Assistant Examiner*—Cynthia Hamilton
*Attorney, Agent, or Firm*—Perman & Green

[57] ABSTRACT

A film forming, radiation sensitive resist composition having improved thermal stability and a reduced dissolution rate in developer solutions, comprised of a sensitizer and a polyalkenyl phenol such as a polyvinyl phenol cross-linked, prior to irradiation, with a poly-functional cross-linking agent such as dimethylol p-cresol or hexamethylene tetramine.

20 Claims, No Drawings

CROSS-LINKED POLYALKENYL PHENOL BASED PHOTORESIST COMPOSITIONS

BACKGROUND OF THE INVENTION

1. Field of the Invention

The present invention is directed to photoresist compositions and more particularly to photoresist compositions containing cross-linked polyalkenyl phenols as the polymeric binder.

2. The Prior Art

The formation of resist masks in the manufacture of integrated circuits using radiation sensitive films which contain a film-forming thermoplastic polymeric binder mixed with a radiation sensitive compound is known.

The use of such materials in integrated circuit technology is based on their property to permit the "engraving" of circuit images of predetermined dimensions on a monolithic substrate material such as silicon. Layers of the radiation sensitive material are formed on the substrate and exposed to light or other activating radiation such as electron beam or x-rays in a patternwise manner using a mask corresponding to the circuit design. By means of a subsequent developing process, the desired resist patterns are formed on the substrate surface. Thereafter, the substrate is subjected to an additive or subtractive process, such as metallization or etching, with the remaining portions of the resist layer acting to protect the substrate.

According to their interaction with the activating radiation, a distinction is made between negative and positive photoresist systems. The term negative refers to a photoresist which after exposure in a suitable solvent is insoluble, whereas the unexposed resist zones are dissolved by the developer. As a result, free and unprotected zones are obtained on the substrate surface which correspond to the opaque dark areas of the photomask. In a positive working photoresist system, the photoresist is altered upon exposure in such manner that it is subsequently soluble in the developer (e.g. aqueous buffered alkali). The exposed areas of the photoresist film are removed upon developing, and the free unprotected areas on the substrate correspond to the transparent parts on the photomask.

In U.S. Pat. No. 4,104,070, it is disclosed that when a positive photoresist system is modified with a 1-hydroxyethyl-2-alkylimidazoline and heated, after image-wise exposure, for a sufficient period of time to a sufficient temperature to render the exposed areas insoluble in alkaline developer and then blanket exposed with actinic radiation, a negative photoresist image is obtained. If there is no thermal treatment and blanket exposure after the image-wise exposure, a positive image is obtained from the same mask.

Among the polymeric resins which have been considered for use as photoresist materials and especially for use in the process disclosed in U.S. Pat. No. 4,104,070 are polyalkyenyl phenols such as polyvinyl phenol of the type disclosed in U.S. Pat. No. 4,439,156. A major drawback in attempting to use these polymeric materials as photoresist materials is that photoresist systems prepared using these materials exhibit very high dissolution rates for development in alkali solutions normally used as developers. The very high dissolution rates prevent adequate control over processes to obtain the necessary image profiles, and in the case of low dimension configurations, e.g. 1 lines, such configurations are totally lost. Attempts to decrease the dissolution rate by substituting alkali solutions of relatively weak concentration are unsuccessful as the weakened solutions are depleted too quickly to be of use in the manufacture of devices.

A second drawback to the use of polyalkenyl phenols in the preparation of photoresist systems is that they soften and begin to flow at about 150° C. The tendency to flow distorts the resist image pattern, and in the fine geometry patterns which are required, for example, in integrated circuit manufacture, the distortion can result in dimensional changes or even in the closing of fine lines. Such distortion can take place when the resist image is baked to improve the adhesion of the resist to the substrate or when the resist image is heated during the processing of the substrate such as by hot etchant solutions, ion implantation or plasma etching.

There is, therefore, a need in the art to control the dissolution rate and to increase the flow resistance of photoresist compositions in which a polyalkenyl phenol resin comprises the polymeric binder for the resist.

SUMMARY OF THE INVENTION

It has now been found that the dissolution rate of image exposed photoresist systems based on polyalkenyl phenols may be controlled during development to the levels necessary for the manufacture of resists and the thermal stability of such systems increased to a level wherein heat distortion is substantially reduced or eliminated wherein the polyalkenyl phenol is cross-linked with a polyfunctional cross-linking compound prior to its incorporation in the photoresist system.

As will hereinafter be demonstrated, by varying the concentration of the cross-linking agent, the dissolution rate of the image-wise exposed photoresist may be controlled to provide a tailored development rate within a desired range due to the decreased dissolution rate of the cross-linked polyalkenyl phenol in the developer. As will hereinafter be further demonstrated, in addition to retarding the dissolution rate of the image exposed photoresist, the photoresist prepared from the cross-linked-linked polyalkenyl phenol exhibits improved thermal stability, i.e., the images in the resist undergo little or no dimensional changes or distortion at temperatures in the order of 170° C.

DESCRIPTION OF THE PREFERRED EMBODIMENTS

The polyalkenyl phenol used in the preparation of the cross-linked photoresist compositions of the present invention is a polymer of an alkenyl phenol of the general formula (I)

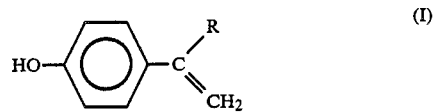

wherein R represents a hydrogen atom or a linear or branched chain alkyl group having 1 to 4 carbon atoms. Polyalkenyl phenols represented by the general formula (I) are described in U.S. Pat. No. 4,028,340, U.S. Pat. No. 4,032,513 and J. Chem. Soc., C 1968(8) 996–9. Specific examples of polyalkenyl phenols of the general formula (I) are polyvinylphenol (polyhydroxystyrene), poly-α-methylvinylphenol, polyα-ethylvinylphenol, poly- -propylvinylphenol, poly- -isopropylvinylphenol, poly- -n-butylvinylphenol, and poly- -isobutylvinylphenol.

The term "polyalkenyl phenol" also includes within its meaning poly(alkylated alkenyl phenol) wherein alkyl substitution is present on the aromatic nucleus of the phenol. Poly(alkylated alkenyl phenol) can be synthesized by a method involving alkylating the polyalkenyl phenol with an alkylating agent to form the ethylene, propylene or isobutylene derivative; a method disclosed in *Polymer Letters Edition*, vol. 14, p. 463–465 (1976) which comprises polymerizing an acetylated alkyl-alkenylphenol and hydrolyzing the polymer obtained; or a method disclosed in *Makromol. Chem.* 175 p. 791–810 (1974) which comprises synthesizing an alkylated alkenylphenol, and polymerizing the alkylated alkenylphenol.

The polyalkenyl phenols used to prepare the photoresist compositions of the present invention may thus be represented as being composed substantially of monomeric units having the general formula (II)

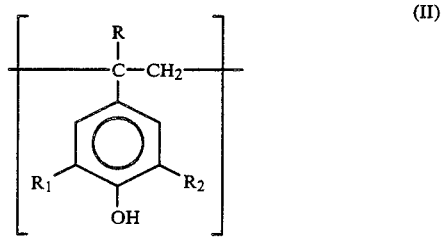

wherein R represents a hydrogen atom or an alkyl group having 1 to 4 carbon atoms and $R_1$ and $R_2$ represents a hydrogen atom or an alkyl group having 1 to 18 carbon atoms.

The molecular weight of the polyalkenyl phenol used in the practice of the present invention ranges from about 1,000 to about 30,000, polymeric materials having a molecular weight in the range of about 5,000 to about 15,000 being preferred.

Polyalkenyl phenol resins are commercially available from the Maurzen Oil Corporation under the trademark designation Resin-M, which is a polyvinyl phenol having a molecular weight of about 10,000.

To prepare the cross-linked polyalkenyl phenol compositions of the present invention, the polymeric material and the polyfunctional cross-linking compound are added to a suitable solvent to provide a solution containing about 15 to about 40 percent by weight of the materials. Suitable solvents include commonly used organic solvents including alkyl acetates such as butyl acetate, isoamyl acetate, n-hexyl acetate, Cellosolves, such as Cellosolve acetate (ethylene glycol monoethyl ether acetate), Carbitols, such as Carbitol acetate (diethylene glycol monoethyl ether acetate), higher polyethylene and polypropylene glycol ethers and ether-esters, and the like, as well as mixtures thereof, can be present.

Amounts of the polyfunctional cross-linking compound which are effective to provide the irradiated film dissolution rates and flow resistance normally desired in resist fabrication processes are in the order of at least about 1 to about 15 percent by weight based on the weight of the polyalkenyl phenol. The optimum amount of cross-linking agent will vary depending upon the dissolution rate of the irradiated resin film desired and the developer solution chosen, but generally about 6 to about 12 percent by weight of the polyfunctional cross-linking compound based on the weight of the polyalkenyl phenol will provide acceptable, tailored results.

The term "polyfunctional cross-linking compound" includes within its meaning compounds having at least 2 functional groups selected from hydroxyl, amine, and aldehyde. Examples of polyfunctional compounds useful in the practice of the present invention included polymethylol phenolic compounds such as dimethylol phenol substituted with $C_1$–$C_{10}$ alkyl groups such as dimethylol p-cresol, dimethylol-p-octylphenol, demethylol-p-ethyl phenol and dimethyl-p-isopropyl phenol. Other useful polyfunctional cross-linking compounds include hydrolyzable polyamines such as hydrolyzable aliphatic polyamines such as hexamethylene tetramine.

To effect cross-linking, the solution of polyalkenyl phenol and polyfunctional cross-linking compound is heated at an elevated temperature, e.g. about 125° to about 150° C. for about 0.8 to about 1.2 hours with suitable agitation. Reaction times shorter than those specified have been found to provide insufficient cross-linking of the polyalkenyl phenol while heating time periods substantially in excess of about 1.2 hours results in the formation of useless gels.

The cross-linking of the polyalkenyl phenol with the polyfunctional cross-linking compound may be illustrated by the heating of polyvinyl phenol in the presence of dimethylol p-cresol in accordance with the equation:

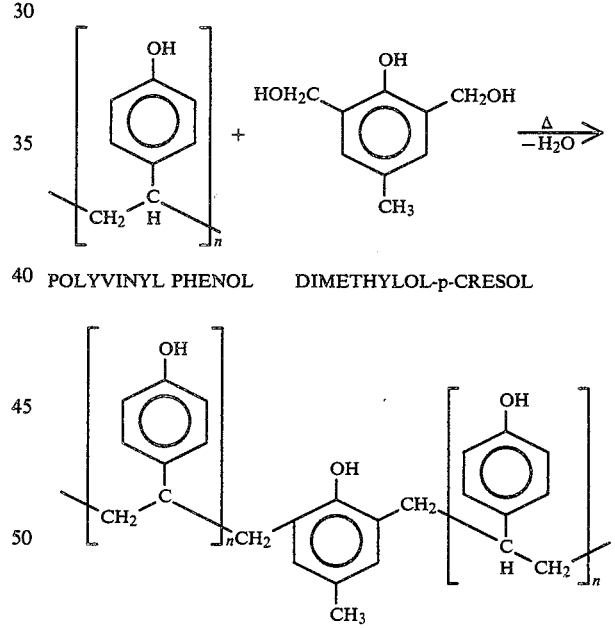

POLYVINYL PHENOL     DIMETHYLOL-p-CRESOL where n indicates repeating polyvinyl phenol monomer units.

The dissolution and flow rates of the irradiated cross-linked polyalkenyl phenol of the present invention are inversely proportional to the degree of cross-linking in the cross-linked polyalkenyl phenol structure. The cross-linked structure, although it exhibits a lowered dissolution rate in developer solutions such as aqueous alkaline developer solutions, exhibits no diminution in activity as a photoresist material when combined with a photosensitizer and irradiated using conventional radiation sources.

Photosensitizer compounds which may be mixed with the cross-linked polyalkenyl phenol resin to render the resin radiation activatable are well known and include, for example, aromatic nitro compounds such as 2-nitrofluorene, picramide, trinitroaniline, nitronaphthalene, 5-nitroacenaphthalene and the like; ketones such as benzophenone, Michler's ketone and the like; quinones such as 4,8-bis[(6-diazo-5,6-dihydro-5-oxo-1-naphthalenyl)sulfonyloxymethyl]tricyclo[5.2.1.0$^{2,6}$]-decane, naphthaquinone, anthraquinone, 2,3-diphenylanthraquinone and the like; and anthrones such as benzanthone; and pyrylium salts. Conventionally, about 0.1 to about 25% by weight of the sensitizer based on the weight of the cross-linked polyalkenyl phenol is included in the photoresist system.

To form a resist mask, a thin film of the photosensitized cross-linked polyalkenyl phenol is solution cast or spun onto a desired substrate for use as a photoresist. The concentration of the polyalkenyl phenol in the solvent is adjusted so as to deposit a film of the desired thickness, generally about 0.5 to 3.0 um. The solvent is then removed in a conventional manner as by drying, evaporating and the like. After drying, the film is baked at about 80° to about 110° C. to improve adhesion and handling characteristics of the film.

The photoresist is then exposed to radiation which will cause the sensitizer to react. Conventionally, actinic light is used, as well as various forms of high energy radiation such as x-ray and electron beam. The exposure takes place either through a pattern mask or by directing a shaped of radiation across the surface of the photosensitive resist layer. A pattern is developed in the layer to expose portions of the substrate by subjecting the layer to a developer solution which removes either the exposed or the unexposed areas of the resist. The irradiated film is developed by immersing, generally for about 1 to 5 minutes in an alkaline developer based on an alkaline solution containing sodium hydrogen phosphate, sodium metasilicate, or sodium hydroxide.

If a negative photoresist is desired, about 2 to about 10 percent by weight, based on the weight of the cross-linked polyalkenyl phenol, of a 1-hydroxyethyl-2-alkylimidazoline is incorporated in the cross-linked polyalkenyl phenol solution. The photoresist layer, prior to development is heated, after image-wise exposure for about 10 to about 20 minutes to approximately 110° C. After this thermal treatment, the photoresist layer is blanket exposed (i.e. without a mask) for about 6 seconds at 150 milliwatts/cm$^2$ and then developed in an alkaline developer following the procedure of U.S. Pat. No. 4,104,070.

The present invention is illustrated in detail below with reference to the Example, but the invention is not limited to the Example.

EXAMPLE

A series of photoresist compositions were prepared by dissolving about 26 percent by weight Resin-M (Trademark), a polyvinyl phenol having a molecular weight of 10,000, in ethyl cellosolve acetate. To separate solutions of the polyvinyl phenol heated to 130° C., was added varying concentrations of either the polyfunctional cross-linking compound dimethylol-p-cresol (DMC) or hexamethylene tetramine (HMTA). The separate solutions of polyvinyl phenol and cross-linking compound were stirred at 130° C. for 1 hour to effect cross-linking of the polyvinyl phenol. After the cross-linking reaction was completed, the solution of cross-linked polyvinyl phenol was allowed to cool to room temperature. To the cooled solutions were dissolved about 5 percent by weight of 4,8-bis[(6-diazo-5,6-dihydriso-5-oxo-1-naphthalenyl)sulfonyloxymethyl]tricyclo[5.2.1.0$^{2,6}$]decane and 1 percent by weight 1-hydroxyethyl-2 alkylimidazoline with a C$_3$ to C$_{17}$ alkyl residue. These cooled solutions were filtered through a filter with a pore diameter of approximately 1 um and then applied to the surface of a silicon wafer with a thermally generated silicon dioxide layer by means of a spin coating process with 4,000 revolutions/min. The coated wafer was prebaked for 20 minutes at 80° C. The photoresist layer was image-wise exposed through a pattern mask to a source of actinic radiation for about 2 seconds with a source having a power of about 150 milliwatts/cm$^2$ over a wavelength of about 300–450 nanometers.

The image-wise exposed coated wafers were heated for 25 minutes at 100° C. After thermal treatment, the coated wafers were then blanket exposed to a similar actinic light source for approximately 6 seconds. The processed wafers were then developed by immersion in 0.13N Na$_2$SiO$_3$.9H$_2$O alkaline developer solution to obtain a high resolution negative image.

The time required for dissolution of the unexposed areas of the photoresist image was measured by laser interferometry. The time needed to develop out clear images is approximately twice the dissolution time for a large area of unexposed resist.

The dissolution times for the polyvinyl phenol cross-linked with either dimethylol-p-cresol or hexamethylene tetramine at concentrations varying from 7–14 mole% are recorded in the Table below. For purposes of contrast, the procedure of the Example was repeated with the exception that an uncross-linked polyvinyl phenol was used as the photoresist resin. The dissolution time for this comparative composition is also recorded in the Table.

TABLE

Dissolution Rates of Cross-Linked Polyvinyl Phenol Based Photoresists Cross-Linking Compound

| Run No. | mole % DMC | or | mole % HMTA | Approximate Dissolution Time** in Seconds Normalized to a 3μ thick film |
|---|---|---|---|---|
| 1 | 7.0 | | 7.0 | 139 |
| 2 | 10.0 | | * | 186 |
| 3 | 14.0 | | * | 297 |
| Control | 0 | | 0 | 37 |

*Not Run
**Dissolution time inversely proportional to dissolution rate.

By reference to the Table, it is immediately apparent that cross-linking polyvinyl phenol with increasing amounts of either DMC or HMTA causes the dissolution rate of the irradiated resist film to decrease significantly. Thus, the dissolution rates of polyvinyl phenol based photoresists can be controlled and tailored to desired levels by cross-linking the polyvinyl phenol resin prior to image exposure with preselected amounts of a polyfunctional cross-linking agent such as dimethylol-p-cresol and hexamethylene tetramine.

The thermal stability of the photoresist image was determined by baking the irradiated, coated wafers in an oven in a nitrogen atmosphere at a temperature of 170° C. Microphotographs of the resist patterns based on the cross-linked polyvinyl phenol compositions of Runs 1–3 indicated that resist image flow at 170° C. was substantially absent. By way of contrast, thermal stability testing of the resist pattern based on the uncross-linked polyvinyl phenol control run indicated substantial resist image flow at 150° C.

While specific components of the present system are defined above, many other variables may be introduced which may in any way affect, enhance, or otherwise improve the system of the present invention. These are intended to be included herein.

Although variations are shown in the present application, many modifications and ramifications will occur to those skilled in the art upon a reading of the present disclosure. These, too, are intended to be included herein.

We claim:

1. A process for the production of a resist image which comprises depositing a layer on a substrate, the layer comprised of a photosensitizer and a polyalkenyl phenol cross-linked with a polyfunctional cross-linking compound, exposing the layer patternwise to radiation and then developing the pattern-exposed layer.

2. The process of claim 1 wherein the polyalkenyl phenol is polyvinyl phenol.

3. The process of claim 1 wherein the cross-linking agent is a polymethylol phenol.

4. The process of claim 1 wherein the cross-linking agent is a hydrolyzable polyamine.

5. The process of claim 3 wherein the polymethylol phenol is dimethylol p-cresol.

6. The process of claim 4 wherein the polyamine is a hydrolyzable aliphatic polyamine.

7. The process of claim 6 wherein the aliphatic polyamine is hexamethylene tetramine.

8. The process of claim 1 wherein the polyalkenyl phenol is cross-linked with about 1 to about 15 percent by weight of the polyfunctional compound based on the weight of the polyalkenyl phenol.

9. The process of claim 1 wherein the layer contains about 0.1 to about 25 percent by weight of the sensitizer.

10. The process of claim 1 wherein the cross-linked polyalkenyl phenol containing layer is exposed to ultraviolet radiation.

11. The process of claim 1 wherein the radiation exposed cross-linked polyalkenyl phenol layer is developed in an alkaline solution.

12. A film forming, radiation sensitive photoresist composition comprised of a photosensitizer and a polyalkenyl phenol cross-linked with a polyfunctional cross-linking agent.

13. The composition of claim 12 wherein the polyalkenyl phenol is polyvinyl phenol.

14. The composition of claim 12 wherein the cross-linking agent is a polymethylol phenol.

15. The composition of claim 12 wherein the cross-linking agent is hydrolyzable polyamine.

16. The composition of claim 14 wherein the polymethylol phenol is dimethylol p-cresol.

17. The composition of claim 15 wherein the polyamine is a hydrolyzable aliphatic polyamine.

18. The composition of claim 17 wherein the aliphatic amine is hexamethylene tetramine.

19. The composition of claim 12 wherein the polyalkenyl phenol is cross-linked with about 1 to about 15 percent by weight of the polyfunctional compound based on the weight of the polyalkenyl phenol.

20. The composition of claim 12 wherein composition contains about 0.1 to about 25 percent by weight of the photosensitizer.

* * * * *